(12) United States Patent
Sung

(10) Patent No.: US 10,755,965 B2
(45) Date of Patent: Aug. 25, 2020

(54) METHOD AND DEVICE ISOLATION STRUCTURE IN FINFET

(71) Applicant: Varian Semiconductor Equipment Associates, Inc., Gloucester, MA (US)

(72) Inventor: Min Gyu Sung, Essex, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/694,093

(22) Filed: Nov. 25, 2019

(65) Prior Publication Data

US 2020/0090982 A1    Mar. 19, 2020

Related U.S. Application Data

(62) Division of application No. 15/969,419, filed on May 2, 2018, now Pat. No. 10,546,770.

(51) Int. Cl.
| | |
|---|---|
| *H01L 21/762* | (2006.01) |
| *H01L 29/66* | (2006.01) |
| *H01L 21/3065* | (2006.01) |
| *H01L 29/78* | (2006.01) |
| *H01L 21/8234* | (2006.01) |

(52) U.S. Cl.
CPC .... *H01L 21/76232* (2013.01); *H01L 21/3065* (2013.01); *H01L 21/823431* (2013.01); *H01L 29/66795* (2013.01); *H01L 29/66803* (2013.01); *H01L 29/7851* (2013.01); *H01L 29/7853* (2013.01)

(58) Field of Classification Search
CPC ......... H01L 21/76232; H01L 29/66803; H01L 29/66795; H01L 21/3065; H01L 21/823431; H01L 29/7853; H01L 29/7851
See application file for complete search history.

(56) References Cited

U.S. PATENT DOCUMENTS

| | | | |
|---|---|---|---|
| 9,893,062 B2 * | 2/2018 | Shen ............... | H01L 21/823475 |
| 2005/0035427 A1 * | 2/2005 | Park ................... | H01L 29/7835 257/510 |
| 2014/0080276 A1 | 3/2014 | Brand et al. | |
| 2014/0346599 A1 * | 11/2014 | Cai .................... | H01L 29/7851 257/347 |
| 2015/0162437 A1 * | 6/2015 | Oh .................... | H01L 21/02107 257/288 |
| 2015/0303283 A1 | 10/2015 | Chien et al. | |
| 2015/0311073 A1 | 10/2015 | Srinivasan et al. | |
| 2016/0027684 A1 | 1/2016 | Chang et al. | |
| 2016/0181383 A1 | 6/2016 | Huang et al. | |
| 2016/0240444 A1 * | 8/2016 | Chao ................ | H01L 29/66795 |
| 2016/0322462 A1 | 11/2016 | Chou et al. | |
| 2016/0379982 A1 * | 12/2016 | You .................... | H01L 29/0657 257/369 |

(Continued)

*Primary Examiner* — Ahmed N Sefer

(57) ABSTRACT

A method of forming a semiconductor device. The method may include providing a semiconductor device structure. The semiconductor device structure may include a semiconductor fin; and a mask, disposed over the semiconductor fin, the mask defining a plurality of openings, wherein the semiconductor fin is exposed in the plurality of openings. The method may further include directing angled ions into the plurality of openings, wherein a plurality of trenches are formed in the semiconductor fin, wherein a given trench of the plurality of trenches comprises a reentrant profile.

12 Claims, 5 Drawing Sheets

(56) References Cited

U.S. PATENT DOCUMENTS

2017/0317076 A1* 11/2017 Shen .................... H01L 29/0847
2017/0338229 A1* 11/2017 Oh ...................... H01L 29/66674
2018/0005830 A1    1/2018 Laven et al.
2018/0082844 A1    3/2018 Sherman et al.

* cited by examiner

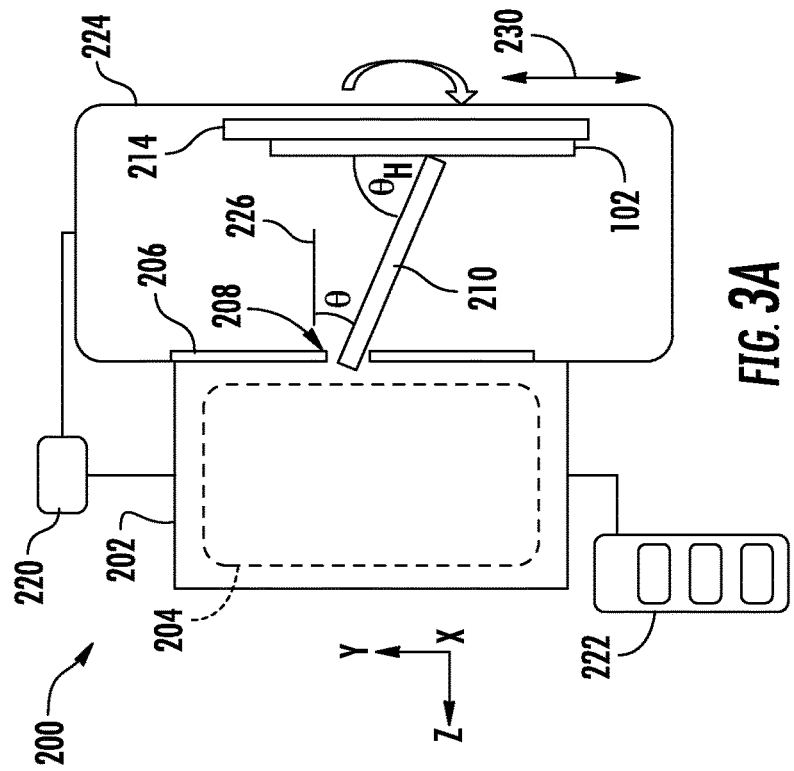
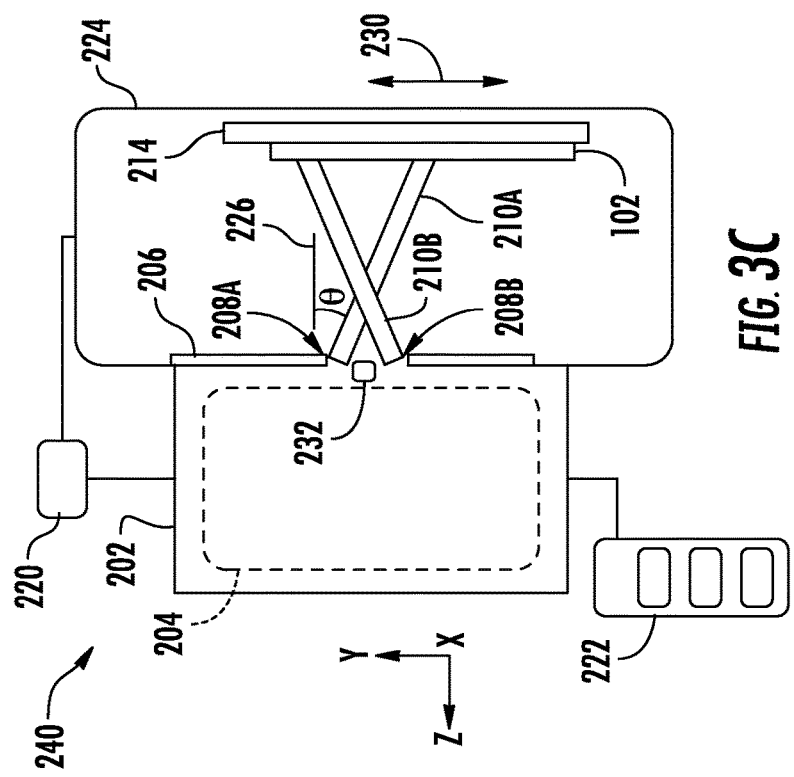
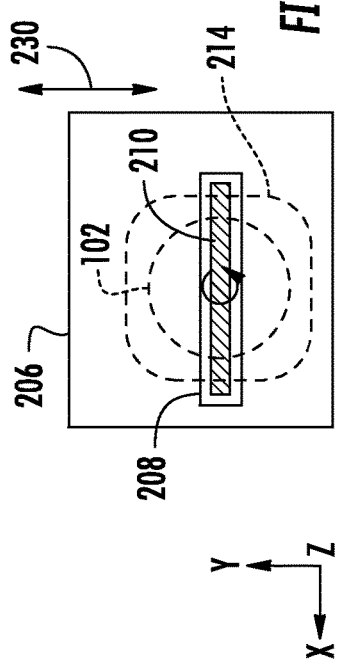

METHOD AND DEVICE ISOLATION STRUCTURE IN FINFET

CROSS-REFERENCE TO RELATED APPLICATIONS

This application is a divisional of, and claims the benefit of priority to, U.S. patent application Ser. No. 15/969,419, filed May 2, 2018, entitled "Method and Device Isolation Structure in Finfet," which application is incorporated herein by reference in its entirety.

FIELD

The present embodiments relate to semiconductor device structures, and more particularly, to structures and processing for transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), involves challenging processing issues. In many finFET designs, isolation of devices along a given fin is accomplished using trench isolation. To isolate a given portion of a fin for forming a transistor device, a pair of trench structures may be formed within the fin, by etching the fin to form trenches, and subsequently filling the trenches with an insulator, such as silicon oxide or other material. These trench structures may have a non-ideal shape, where the width of the trenches decreases with increasing depth from the surface of the trench. Such tapered trench structures may provide unsuitable device isolation. Moreover, proper filling of the trench structures with insulator may be difficult, especially for high-aspect ratio trenches where the ratio of trench depth/trench width exceeds 2-3.

With respect to these and other considerations, the present disclosure is provided.

BRIEF SUMMARY

In one embodiment, a method of forming a semiconductor device, may include providing a semiconductor device structure. The semiconductor device structure may include a semiconductor fin; and a mask, disposed over the semiconductor fin, the mask defining a plurality of openings, wherein the semiconductor fin is exposed in the plurality of openings. The method may further include directing angled ions into the plurality of openings, wherein a plurality of trenches are formed in the semiconductor fin, wherein a given trench of the plurality of trenches comprises a reentrant profile.

In another embodiment, a semiconductor device structure may include a semiconductor fin, disposed on a substrate, the semiconductor fin including a fin portion. The semiconductor device structure may also include a first trench isolation structure, arranged on a first end of the fin portion, and a second trench isolation structure, arranged on a second end of the fin portion, opposite the first end, wherein the first trench isolation structure and the second trench isolation structure comprise a reentrant profile.

In a further embodiment, a method for forming a finFET device may include providing a semiconductor fin on a substrate and forming a mask on the semiconductor fin, the mask comprising at least a pair of openings. The method may further include directing an angled ion beam into the pair of openings, wherein a pair of trenches are formed in the semiconductor fin. The ion beam may have a shape of a ribbon beam, where the ion beam defines a trajectory forming a non-zero angle of incidence with respect to a perpendicular to a plane of the substrate.

BRIEF DESCRIPTION OF THE DRAWINGS

FIG. 3A shows a processing apparatus, depicted in schematic form, in accordance with embodiments of the disclosure;

FIG. 3B depicts a face view of an extraction arrangement for the processing apparatus of FIG. 5A;

FIG. 3C shows another processing apparatus, depicted in schematic form, in accordance with embodiments of the disclosure.

DETAILED DESCRIPTION

Figures 1A, 1B:
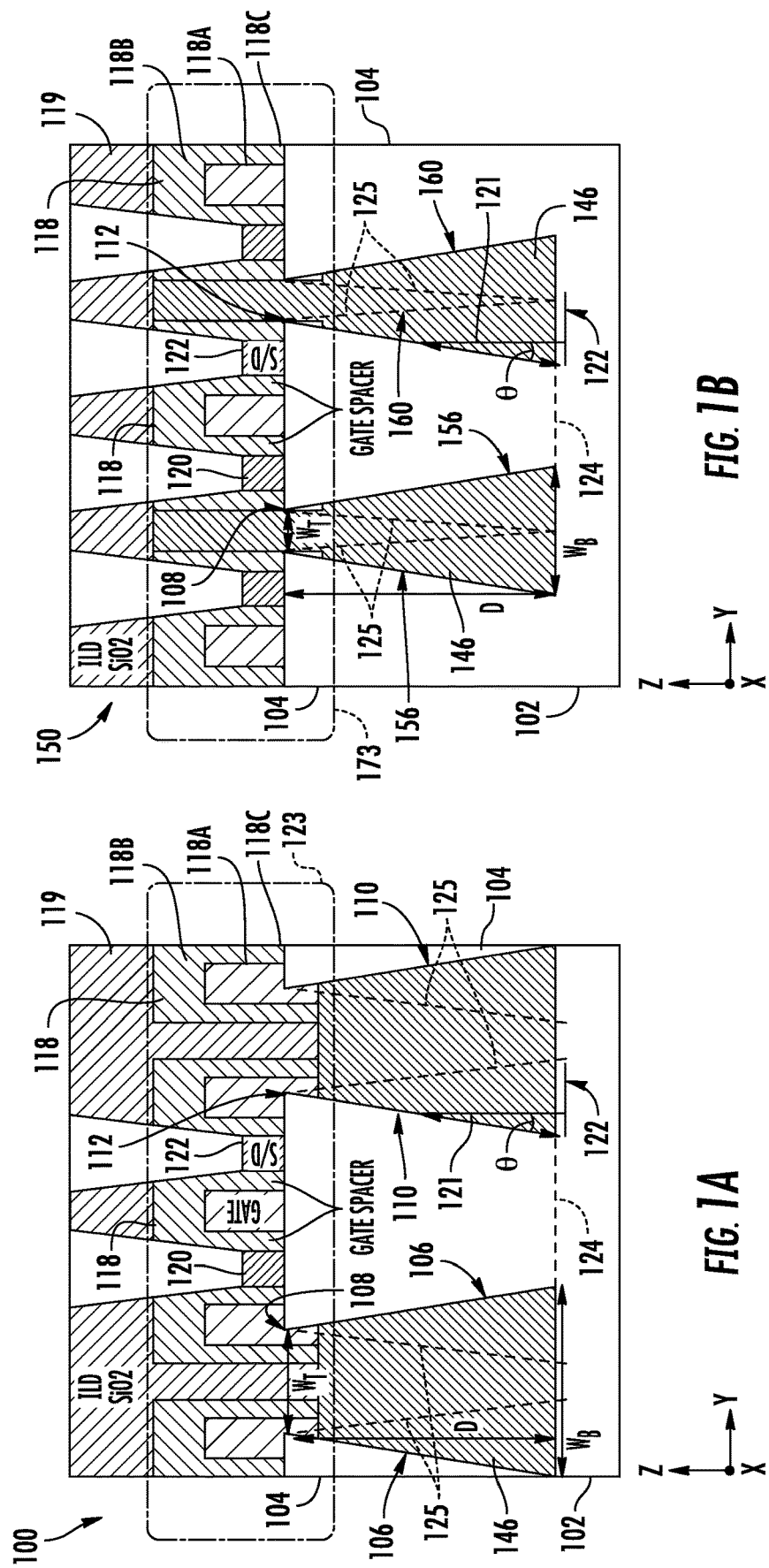
FIG. 1A depicts a side cross-sectional view of a semiconductor device structure, at various stages of fabrication, according to embodiments of the disclosure.
FIG. 1B depicts a side cross-sectional view of another semiconductor device structure, at various stages of fabrication, according to further embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Turning now to FIG. 1A there is shown a semiconductor device structure 100, according to embodiments of the disclosure. The semiconductor device structure 100 is shown in side cross-section in FIG. 1A, as represented by the Z-Y plane of the Cartesian coordinate system shown.

The semiconductor device structure 100 may include a semiconductor fin 104, disposed on a substrate 102, where the substrate 102 may represent any suitable substrate. As an example, the substrate 102 may include a monocrystalline semiconductor portion, such as silicon, where the semiconductor fin 104 is integrally formed from the monocrystalline semiconductor portion. The semiconductor device structure 100 may further include a gate 118, disposed on the semiconductor fin 104. The gate 118 may include a gate conductor 118A, cap 118B, and sidewall spacers 118C as in know gates. As such, the semiconductor device structure 100 may represent a finFET device at a stage of fabrication where a transistor structure, including a source/drain region and gate have been formed. The semiconductor fin 104 may be divided into different portions at the stage of processing shown in FIG. 1A, and may include a fin portion 124, shown in a middle region of the semiconductor fin 104 in the view of FIG. 1A. The semiconductor device structure may further include an interlevel dielectric layer 119, as shown. The semiconductor device structure 100 may further include a first trench isolation structure 106, arranged on a first end 108 of the fin portion 124; and a second trench isolation structure 110, arranged on a second end 112 of the fin portion 124, opposite the first end 108. As such a region 120 and a region 122 may represent source/drain regions of a transistor structure 123, including the gate 118. The first trench isolation structure 106 and the second trench isolation structure 110 may serve to electrically isolate the transistor structure 123, formed in the region of fin portion 124 from other regions of the semiconductor device structure 100, including other devices formed on other portions of the semiconductor fin 104.

As shown in FIG. 1A, one feature of the semiconductor device structure 100 is the reentrant profile of the first trench isolation structure 106 and the second trench isolation structure 110. A defining characteristic of the reentrant profile involves a trench bottom width $W_B$, where the trench bottom width $W_B$ (along the Y-axis) is greater than a top width $W_T$ of a given trench isolation structure at the top, along the upper surface of the semiconductor fin 104. Accordingly, as shown in FIG. 1A, the width of the first trench isolation structure 106 and the second trench isolation structure 110 may increase with increasing depth from an upper surface of the semiconductor fin 104. Also shown in FIG. 1A is a reference trench profile 125, where the width of the trench decreases with increasing depth, as in known device structures.

As shown in FIG. 1A, the semiconductor device structure 100 may be characterized by a trench depth D, wherein a ratio of trench depth to trench bottom width is less than 3/1. In other words, the width of trench isolation structures is not very small as compared to the depth of the trench isolation structures. This aspect ratio contrasts with known trench isolation structures where a ratio of trench depth to trench width may be on the order of 3, 5 or greater in many instances. At the stage of formation in FIG. 1A, the semiconductor device structure 100 is filled with an insulator material 146. As an example, the insulator material 146 may be an oxide, such as a flowable oxide, where the oxide may have properties of a spin-on glass during application.

As such, the insulator material in the first trench isolation structure 106 and the second trench isolation structure 110 (collectively "trench isolation structures") may electrically isolate a transistor structure 123 (see FIG. 2G), formed in the fin portion 124. The reentrant profile or shape of the trench isolation structures may provide superior isolation as compared to known finFET devices where isolation trenches tend to narrow with increasing depth within the trench.

In particular embodiments, the reentrant profile of the first trench isolation structure and the second trench isolation structure may define a non-zero angle of inclination with respect to a perpendicular to a plane of the substrate, shown as θ, wherein a value of the non-zero angle of inclination ranges from 5 degrees to 40 degrees. The embodiments are not limited in this context. In some examples, the trench depth may range from 150 nm to 250 nm, the active fin height may range from 30 nm to 50 nm, while the fin width ranges from 7 nm to 15 nm. In FIG. 1A, the semiconductor device structure 100 represents a double diffusion break structure where two "dummy" gates are disposed between active gates. Thus, all of the gates 118, save the middle gate in FIG. 1A, are dummy gates.

In other embodiments, a reentrant trench may be implemented in a single diffusion break structure where a given active gate is spaced from a next active gate by just one "dummy" gate. Turning now to FIG. 1B there is shown a semiconductor device structure 150, according to other embodiments of the disclosure, where the semiconductor device structure 150 is based upon the single diffusion break structure. The semiconductor device structure 150 shares similar features to semiconductor device structure 150, where like features are labeled the same. In this structure, the middle gate of gates 118 is an active gate, as well as the two outermost gates on the left and right side, while two "dummy" gates are disposed between the active gates. The transistor structure 173 differs from the transistor structure 123, where a first trench isolation structure 156 and a second trench isolation structure 160 are considerably narrower than the counterparts of transistor structure 123. For example, WT of transistor structure 173 may be less than half the value of WT of transistor structure 123. As shown, the ends of the fin portion 124 are not disposed under dummy gates as in the configuration of FIG. 1A. Notably, the reference trench profile 125, when implemented in a single diffusion break structure, results in an exceedingly narrow trench isolation structure at the bottom, as illustrated in FIG. 1B.

In the embodiments of a double diffusion break structure, the upper width of a trench isolation structure may be twice the gate pitch, and for a single diffusion break structure may be 1 times the gate pitch, where the gate pitch ranges from 40 nm to 70 in different embodiments. As an example, for a 5 degree angle of inclination, the lower width may be 35 nm greater than the upper width, while for a 40 degree angle of inclination the lower with may be 333 nm greater than the upper width.

FIGS. 2A-2F depict a side cross-sectional view of the semiconductor device structure 100, at various stages of fabrication, according to embodiments of the disclosure. At FIG. 2A, a set of layers are disposed on the semiconductor fin 104. A layer 130 is disposed directly on the semiconductor fin 104, where the layer 130 may be a silicon nitride layer in some embodiments. An additional layer, layer 132, is disposed on the layer 130. As an example, the layer 132 may be a known hardmask layer made of any suitable material such as organic optical planarization layer, and may generally differ from the material of layer 130. In addition, a layer 134 is disposed over the layer 132, where the layer 134 may represent a patterned photoresist layer, patterned according to known lithography processes. The patterned photoresist layer may include a plurality of openings, shown as openings 135, where the openings 135 may be used to transfer a pattern into the semiconductor fin 104 for forming trench isolation structures, as discussed below.

Figure 2A:
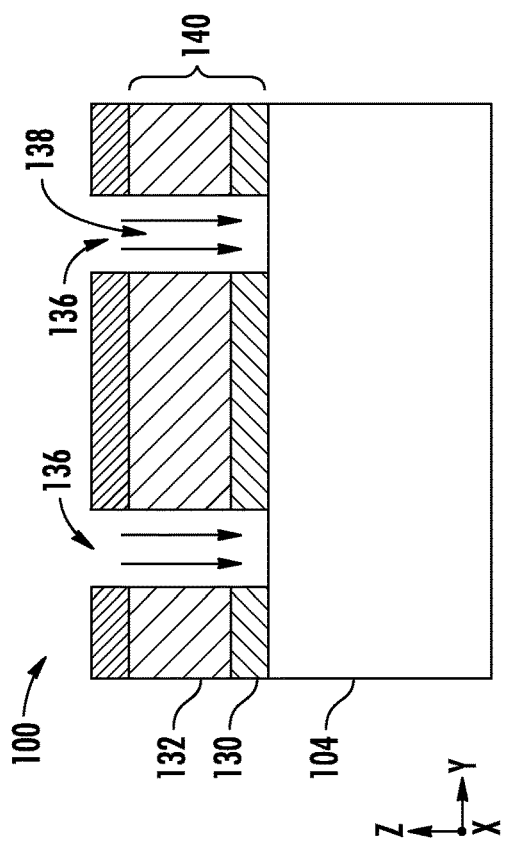
FIGS. 2A-2F depict a side cross-sectional view of a semiconductor device structure, at various stages of fabrication, according to embodiments of the disclosure.
Figure 2B:
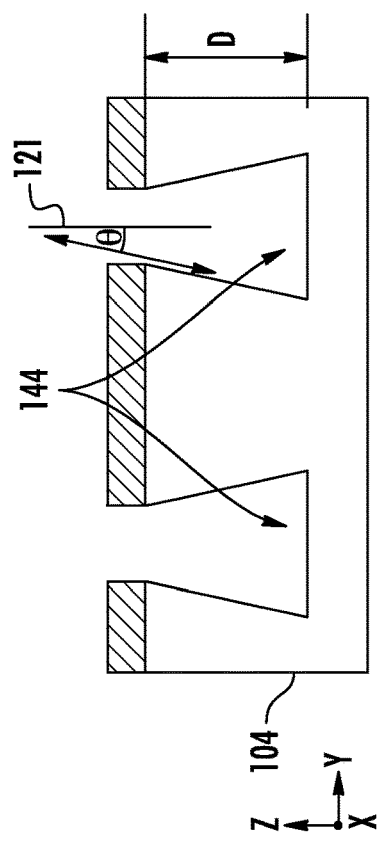

Turning now to FIG. 2B, there is shown a subsequent instance where etching species 138 are directed to openings 135, forming trenches 136, within the layer 132 and layer 130. The etching species 138 may be a known reactive ion etching (RIE) mixture in some embodiments. As such, the etching species 138 may selectively etch, in at least one distinct etching operation, the layer 130 and the layer 132, with respect to the semiconductor fin 104. While not shown, after the instance in FIG. 2B, the layer 134 may be removed. Accordingly, at this stage of fabrication, the semiconductor device structure 100 includes the semiconductor fin 104, and a mask 140, disposed over the semiconductor fin 104, where the mask 140 includes the layer 130 and the layer 132, and defines a plurality of openings, as represented by the trenches 136. As such, the semiconductor fin 104 is exposed at the bottom of the trenches 136.

Figure 2C:
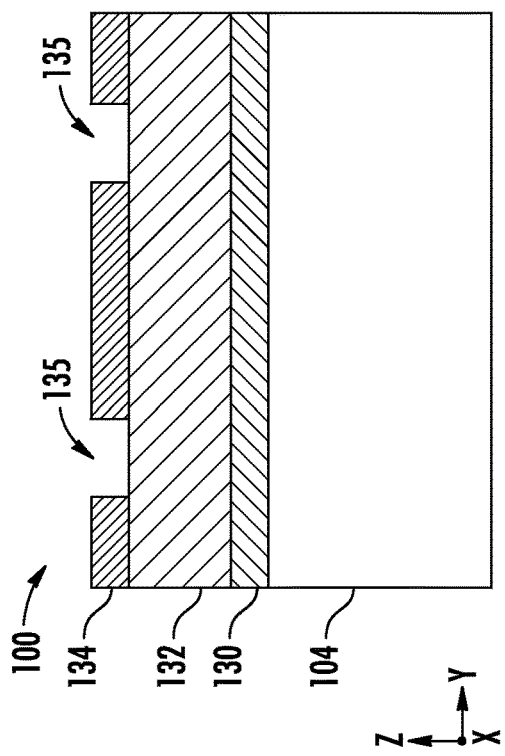
Figure 2D:
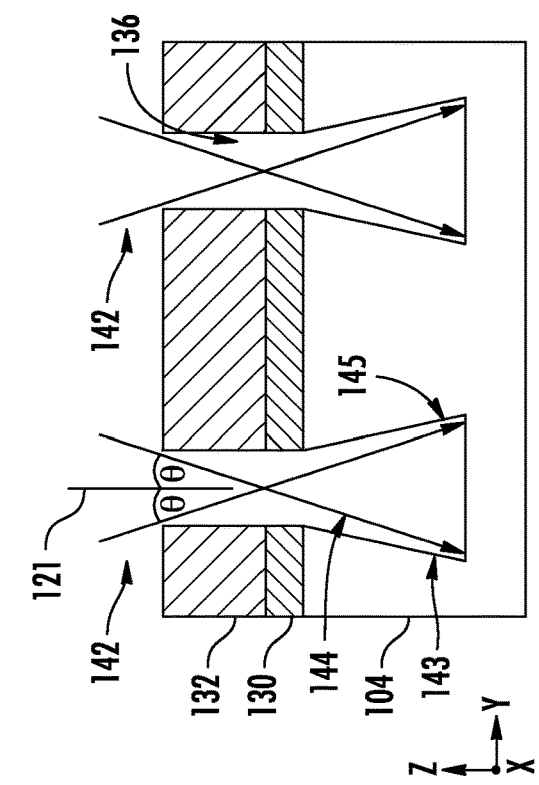

Turning now to FIG. 2C there is shown a subsequent instance where the operation of directing angled ions 142 is performed. The angled ions 142 are directed to the openings defined by the trenches 136. As such, the angled ions 142 may etch the semiconductor fin 104, forming a plurality of trenches in the semiconductor fin 104. The plurality of trenches are represented by trenches 144. The angled ions 142 may be provided in a reactive ion etching mixture, wherein the angled ions 142 selectively etch the semiconductor fin 104 with respect to other layers, such as layer 132 and layer 130. Subsequently, the layer 132 may be selectively removed, leaving the layer 130, as shown in FIG. 2D.

Figure 2E:
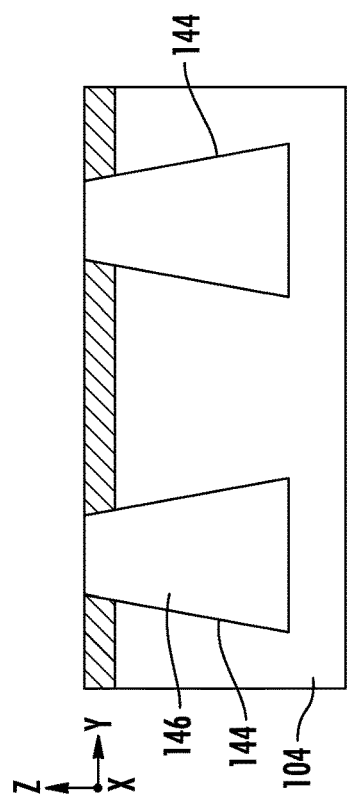

Turning to FIG. 2E, there is shown a subsequent instance after filling of the trenches 144 with insulator material 146. As noted, the insulator material 146 may be an oxide, such as a flowable oxide. Because of the less narrow profile of the trenches 144, the insulator material 146 may readily fill the trenches 144, while avoiding formation of voids or other defects.

Returning to FIG. 2C and FIG. 2D, the angled ions 142 may define an angle of inclination with respect to the perpendicular 121, similar to or the same as the angle of inclination q, characteristic of the trenches 144, after completion of etching using the angled ions 142. Said differently, the trajectory of angled ions 142 may define the angle of inclination, or be similar to the angle of inclination of opposite sidewalls of the trenches 144.

Figure 2F:
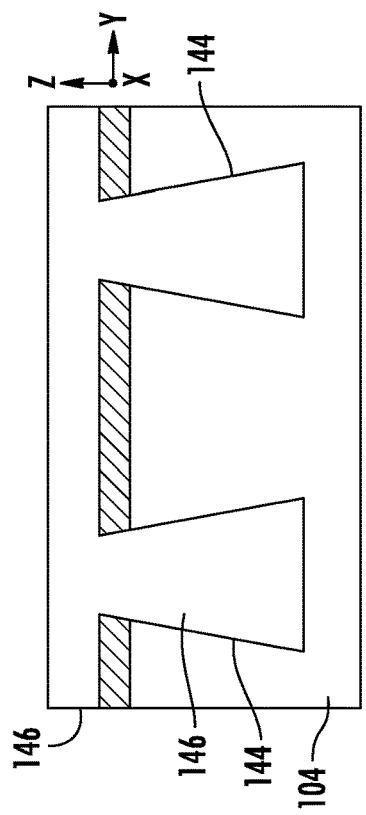

Turning to FIG. 2F, after the instance of FIG. 2E, excess insulator material 146 may be removed from the top of the semiconductor fins 104. Subsequently, known deposition and patterning operations may be employed to form the gate 118, resulting in the semiconductor device structure 100, shown in FIG. 1A.

Figure 2G:
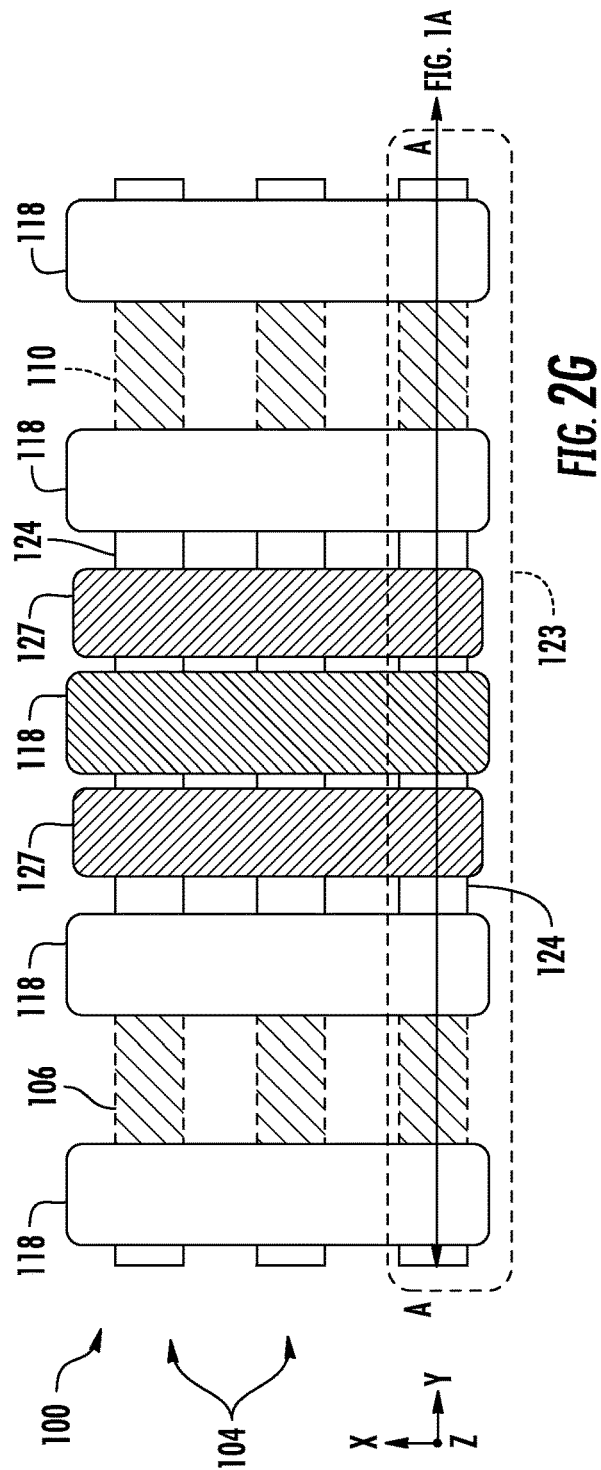
FIG. 2G shows a top view of a variant of the semiconductor device structure of FIG. 1A, in accordance with embodiments of the disclosure.

Turning now to FIG. 2G, there is shown a top view of a variant of the semiconductor device structure 100. The semiconductor device structure 100 shown in FIG. 2G omits various features for clarity, in order to emphasize the geometry of trench isolation structures. Shown in FIG. 2G are source/drain contacts 127. The source/drain contacts 127 in actual devices may cover the exposed part of the fin portion 124, by contacting raised/source drain regions, shown as the region 120 and region 122 in FIG. 1A. In this embodiment, the first trench isolation structure 106, and the second trench isolation structure 110 are arranged in a so-called double diffusion break configuration to isolate transistor devices formed in the fin portion 124 from other devices formed within a given semiconductor fin. Notably, in other embodiments, because of the reentrant profile, the first trench isolation structure 106, and the second trench isolation structure 110 may be arranged in a so-called single diffusion break configuration. Advantageously, the reentrant profile of the trench isolation structures facilitates better device isolation, wherein a single diffusion break configuration may be adequate to isolate devices, avoiding need for a double diffusion break structure.

In further embodiments of the disclosure, angled ions may be provided as an ion beam to etch trench isolation structures. Turning now to FIG. 3A, there is shown a processing apparatus 200, depicted in schematic form. The processing apparatus 200 represents a processing apparatus for performing anisotropic oxidation of a substrate, such as oxidizing fins or fin remnants. The processing apparatus 200 may be a plasma based processing system having a plasma chamber 202 for generating a plasma 204 therein by any convenient method as known in the art. An extraction plate 206 may be provided as shown, having an extraction aperture 208, where an angled ion beam 210 may be extracted to direct angled ions to a substrate 102. The substrate 102, including, for example, the semiconductor fin 104, is disposed in the process chamber 224. A substrate plane of the substrate 102 is represented by the X-Y plane of the Cartesian coordinate system shown, while a perpendicular to the plane of substrate lies along the Z-axis (Z-direction).

As further shown in FIG. 3A, the angled ion beam 210 may be extracted when a voltage difference is applied using bias supply 220 between the plasma chamber 202 and substrate 102, or substrate platen 214, as in known systems. The bias supply 220 may be coupled to the process chamber 224, for example, where the process chamber 224 and substrate 102 are held at the same potential.

According to various embodiments, the angled ion beam 210 may be extracted at a non-zero angle of incidence, shown as θ, with respect to the perpendicular 226. The trajectories of ions within the angled ion beam 210 may be mutually parallel to one another or may lie within a narrow angular range, such as within 10 degrees of one another or less. Thus, the value of θ may represent an average value of incidence angle where the individually trajectories vary up to several degrees from the average value. In various embodiments, the angled ion beam 210 may be extracted as a continuous beam or as a pulsed ion beam as in known systems. For example, the bias supply 220 may be configured to supply a voltage difference between plasma chamber 202 and process chamber 224, as a pulsed DC voltage, where the voltage, pulse frequency, and duty cycle of the pulsed voltage may be independently adjusted from one another.

In various embodiments, a suitable gas or combination of gases, may be supplied by the source 222 to plasma chamber 202. The plasma 204 may generate various species to perform reactive ion beam etching, depending upon the exact composition of species provided to the plasma chamber 202. The species provided by source 222 may be designed according to material to be etched, such as known reactive ion etching species for etching silicon.

In various embodiments, the angled ion beam 210 may be provided as a ribbon ion beam having a long axis extending along the X-direction of the Cartesian coordinate system shown in FIG. 3B. By scanning a substrate platen 214 including substrate 102 with respect to the extraction aperture 208, and thus with respect to the angled ion beam 210 along the scan direction 230, the angled ion beam 210 may etch exposed portions of a semiconductor fin(s) disposed on the substrate 102.

In this example of FIG. 3B, the angled ion beam 210 is provided as a ribbon ion beam extending to a beam width along the X-direction, where the beam width is adequate to expose an entire width of the substrate 102, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm A ratio of beam width to beam length may be in the range 5/1, 10/1, 20/1 50/1, or 100/1. The embodiments are not limited in this context.

Notably, the scan direction 230 may represent the scanning of substrate 102 in two opposing (180 degrees) directions along the Y-direction, or just a scan toward the left or a scan toward the right. As shown in FIG. 2B, the long axis of angled ion beam 210 extends along the X-direction, perpendicularly to the scan direction 230. Accordingly, an entirety of the substrate 102 may be exposed to the angled ion beam 210 when scanning of the substrate 102 takes place along a scan direction 230 to an adequate length from a left side to right side of substrate 102, as shown in FIG. 2B.

Returning also to FIG. 2C, in accordance with various embodiments, the angled ions 142 may be supplied in a plurality of scans of the substrate 102, by rotating the substrate 102 through 180 degrees between scans. Thus, in a first scan, the angled ions 142 may be directed to the sidewall 143, while in a second scan the angled ions 142 may be directed to a sidewall 145, by rotating the substrate 102 180 degrees between the first scan and second scan, while not changing the actual orientation of an ion beam, such as angled ion beam 210.

In other embodiments of the disclosure, a modified apparatus may be used to provide simultaneous etching of a semiconductor fin in different directions. Turning now to FIG. 3C, there is shown another processing apparatus 240, depicted in schematic form. The processing apparatus 240 represents a processing apparatus for performing angled ion treatment of a substrate, and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly and simultaneously, as generally depicted in FIG. 2C. When configured in the shape of a ribbon beam as in FIG. 3B, these angled ion beams may expose an entirety of the substrate 102 to reactive ion etching of semiconductor fins distributed in devices across the substrate 102, by scanning the substrate platen 214 as shown.

Figure 4:
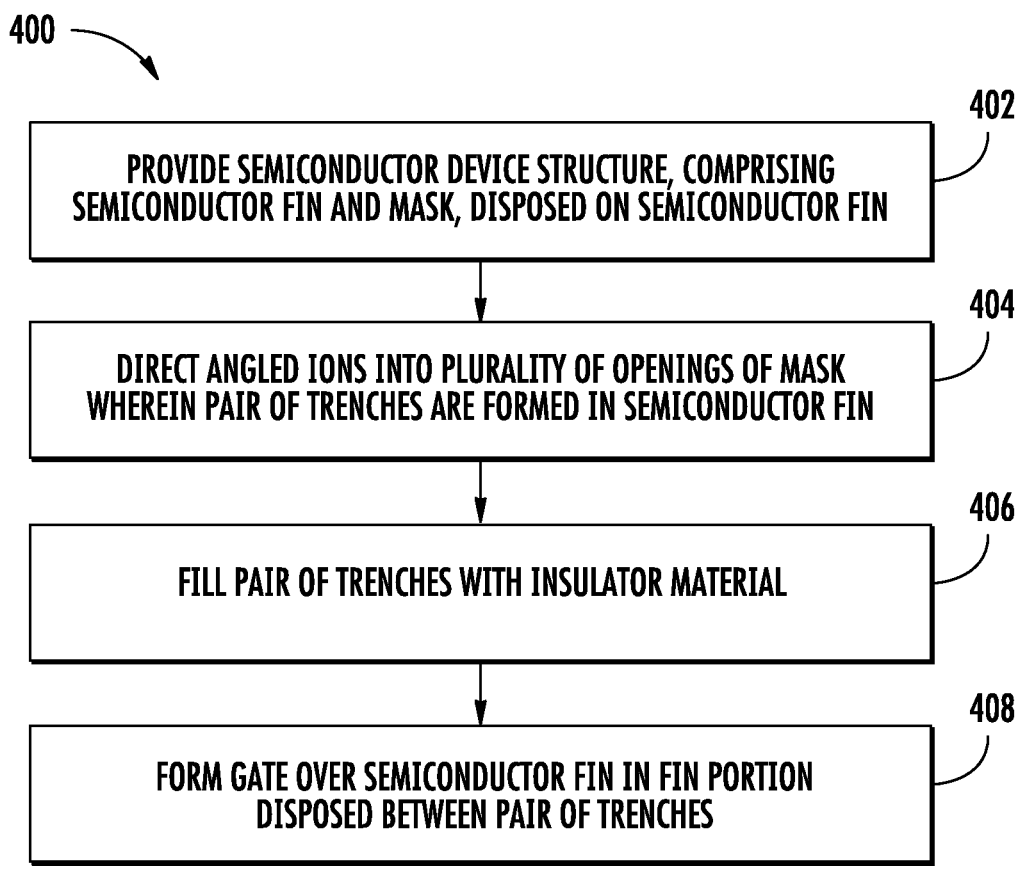
FIG. 4 shows another exemplary process flow, according to further embodiments of the disclosure.

FIG. 4 depicts an exemplary process flow 400, according to embodiments of the disclosure. At block 402, a semiconductor device structure is provided, comprising a semiconductor fin and a mask, disposed on the semiconductor fin. The mask may define a plurality of openings. The mask may be composed of at least one layer, and in some examples, may include a plurality of layers.

At block 404, angled ions are directed into the plurality of openings of the mask, wherein a pair of trenches are formed in the semiconductor fin. The pair of trenches may have a reentrant profile according to various embodiments. According to various embodiments, the angled ions may be provided as an angled ion beam or pair of angled ion beams in a reactive ion etching mixture. The angled ion beam may define a non-zero angle of incidence with respect to a perpendicular to a plane of the substrate. In particular embodiments, the angled ion beam may be a ribbon ion beam.

At block 406, the pair of trenches are filled with an insulator material. In some embodiments, the insulator material may be a flowable oxide. At block 408, a gate is formed over the semiconductor fin, in a fin portion disposed between the pair of trenches. As such, a transistor device may be formed between the pair of trenches, where the pair of trenches provide a single diffusion break configuration for isolating the transistor device.

The present embodiments provide various advantages over known finFET processes. For one advantage, the wider trench bottom provided by the present embodiments allows the use of shallower trenches for trench isolation, for double diffusion break structures, as well as single diffusion break structures, and accordingly avoids using deeper trenches, where such deeper trenches are difficult to fill with insulator. For another advantage, the reentrant profile of trench isolation structures formed from a pair of trenches allow the use of a single diffusion break structure, saving device real estate as compared to double diffusion break isolation The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A semiconductor device structure, comprising:
a semiconductor fin, disposed on a substrate, the semiconductor fin including a fin portion;
a first trench isolation structure, arranged on a first end of the fin portion; and
a second trench isolation structure, arranged on a second end of the fin portion, opposite the first end, wherein the first trench isolation structure and the second trench isolation structure comprise a reentrant profile;
wherein the first trench isolation structure and the second trench isolation structure comprise a trench depth, wherein the first trench isolation structure and the second trench isolation structure comprise a trench bottom width, wherein a ratio of the trench depth to the trench bottom width is less than 3/1.

2. The semiconductor device structure of claim 1, the first trench isolation structure and the second trench isolation structure being filled with an insulator material.

3. The semiconductor device structure of claim 1, the insulator material comprising an oxide.

4. The semiconductor device structure of claim 3, the oxide comprising a flowable oxide.

5. The semiconductor device structure of claim 1, the reentrant profile defining a non-zero angle of inclination with respect to a perpendicular to a plane of the substrate, wherein a value of the non-zero angle of inclination ranges from 5 degrees to 40 degrees.

6. The semiconductor device structure of claim 1, further comprising a gate, disposed over the fin portion, wherein the gate and the fin portion form a transistor device.

7. The semiconductor device structure of claim 6, wherein the first trench isolation structure and the second trench isolation structure form a single diffusion break configuration, electrically isolating the transistor device.

8. The semiconductor device structure of claim 1, wherein the substrate includes a monocrystalline semiconductor portion and wherein the semiconductor fin is integrally formed from the monocrystalline semiconductor portion.

9. The semiconductor device structure of claim 1, wherein a depth of the first trench and a depth of the second trench may range from 150 nm to 250 nm.

10. The semiconductor device structure of claim 1, wherein an active fin height of the semiconductor fin ranges from 30 nm to 50 nm.

11. The semiconductor device structure of claim 1, wherein a fin width of the semiconductor fin ranges from 7 nm to 15 nm.

12. The semiconductor device structure of claim 1, further comprising a double diffusion break structure wherein two "dummy" gates are disposed between active gates.

* * * * *